United States Patent [19]
Kiesewetter et al.

[11] Patent Number: 5,281,875
[45] Date of Patent: Jan. 25, 1994

[54] MAGNETOSTRICTIVE AMBLER MOTOR

[75] Inventors: Erik L. Kiesewetter, Berlin, Fed. Rep. of Germany; Reinhold C. Roth, Vancouver, Canada

[73] Assignee: Dynamotive Corporation, Richmond, Canada

[21] Appl. No.: 931,782

[22] Filed: Aug. 18, 1992

[51] Int. Cl.5 ............................................. H02N 2/00
[52] U.S. Cl. ...................................... 310/26; 310/12
[58] Field of Search .................................. 310/12, 26

[56] References Cited
U.S. PATENT DOCUMENTS
5,097,161 3/1992 Nashiki et al. .................. 310/12

Primary Examiner—Emanuel T. Voeltz
Assistant Examiner—Judson H. Jones
Attorney, Agent, or Firm—Vinson & Elkins

[57] ABSTRACT

An actuator having first and second brake sections, one of the first and second sections movable relative to the other along a predetermined axis, spaced apart pairs of brakes in each of the brake sections, a spring connected between the first and second brake sections for biasing the first section away from the second section along the axis, a pusher rod between the first and second sections parallel to the predetermined axis, operative in response to an activating control signal to expand axially and upon removal of the control signal to contract to its original length, and a device for selectively activating the brakes in each section and the push rod such that the actuator moves in a selected direction along the axis.

19 Claims, 6 Drawing Sheets

MAGNETOSTRICTIVE AMBLER MOTOR

BACKGROUND

The present invention relates to a magnetostrictive motor of the inch worm type having performance characteristics that make it a capable of the precision control required for actuators.

Actuators are distinguished from ordinary drive motors by their controllability. Motors produce stable operation and convert energy efficiently. However, actuators do even more. They must provide superior control performance, high transient response, minimum delay time, high acceleration and damping, bidirectional symmetrical operation and wide tolerance for overload. Considering that modern control elements and sensors have progressed to a high level of accuracy and sophistication, actuators often prove to be the weak link in a system being able to achieve high precision, quick response and more power.

Magnetostrictive materials have enabled actuators to achieve larger force, fine positioning and backlash free applications. Since the early 1970's piezo electric materials (PZT) have been laminated to make active elements that can produce both high force and substantial displacement. In 1974 Burleigh Instruments Inc. designed an actuator in accordance with U.S. Pat. Nos. 3,902,084 and 3,902,085 which utilize three active piezo electric elements, two for clamping and one to generate forward motion. The two clamping elements are positioned on either end of an active, pushing or drive element. Motion is created by clamping a first end of the pusher, activating the pusher so that it expands. Clamping a second end, unclamping the first end and deactivating the pusher. To start the second cycle, the first end is clamped, the second end unclamped and the pusher again activated. A major problem with the latter design is that the elongation of the pusher is reduced in size when the built up strain is released, causing a slipping action. Moreover the significant hysteresis when the load shifts from push to pull reduces precision and stiffness.

Strains of 1,000 parts per million (ppm) can be achieved with PZT but the displacement decreases proportionately with the increase in force. Thus, PZT is suited only for relatively light loads, especially if large displacements are required. The advantage of PZT is its simplicity and compact structure. The disadvantages are the requirement for high voltage drivers, its low energy density and its vulnerability to de-polarization after momentary thermal overloads.

In the 1980's a rare earth alloy in the form of a large crystalline rod known as terfenol was found to exhibit unusually large magnetostrictive strain or elongation. Such crystals are grown as axially elongated rods in the direction of its crystalline axis. When magnetic fields are applied along the axis of these rods they exhibit large amounts of axial elongation. Terfenol exhibit strains of 2,000 ppm under modest magnetic fields. It operates at low voltage and has an energy density of more than 20,000 Joules per cubic meter, or in excess of 20 times greater than that of PZT. Terfenol produces compressive strengths of 700 MPa and the elongation is many time greater than that of PZT at any level of output force. The use of terfenol in inch worm linear motors has been disclosed in a paper entitled "An Application of Giant Magnetostrictive Material to High Power Actuators" by Der. Tomohiko Akuta (Paper No. 18A0107 at the 10th International Workshop on Rare-Earth Magnets and Their Applications, Kyoto, Japan, 16-18 May, 1989, (Proceedings Book: The Society of Non-Traditional Technology, 1-2-8, Toranomon, Minato-ku, Tokyo 105 Japan)) Akuta uses terfenol in place of PZT in a conventional inch worm motor design. Akuta also discloses a shear free clamp which allows conventional terfenol to be used in the clamps notwithstanding its low tensile strength. However, the slipping action inherent in the conventional inch worm motor design is still present in the Akuta design.

Accordingly, it is an object of the present invention to provide an inch worm motor which exhibits reduced slippage. It is a further object of the invention to provide an inch worm type of motor having an improved efficiency.

SUMMARY OF THE INVENTION

According to the invention there is provided an actuator having first and second brake sections, one of the first and second sections movable relative to the other along a predetermined axis. In each of the brake sections there are spaced apart pairs of brakes. A spring is connected between the first and second brake sections for biasing the first section away from the second section along the predetermined axis. A pusher rod is positioned between the first and second sections parallel to the predetermined axis and is operative in response to an activating control signal to expand axially and, upon removal of the signal, to contract to its original length. Means are provided for selectively activating the brakes in each section and the push rod such that the actuator moves in a selected direction along the axis.

Each of the brakes may include a pair of oppositely disposed brake shoes and a magnetostrictive rod mounted so as to extend longitudinally therebetween. The rod may be reversibly expandable in response to a control signal applied to a coil surrounding the rod. Advantageously, the brake shoes may be adapted to engage an interior surface of a containment tube so as to lock an associated brake section of the actuator to the tube by friction. Preferably the rod is made of terfenol.

The brakes in each section may be disposed on either end of pusher rod so as to maintain the rod in compression even with the rod retracted. By keeping the rod in compression unlike conventional inch worm motors in which one end is always unclamped when it is either activated or de-activated, little "slippage" through a change in the elongation occurs since both sides of the rod are clamped at all times. This arrangement improves precision, increases stiffness and reduces hysteresis when the load shifts from push to pull. The brake shoes may be disposed parallel to each other and to the predetermined axis and extend out from one face of a plate at diametrically opposed peripheral regions thereof such that ends of the plates can flex outwardly of the axis in response to elongation of the rod.

The use of two simultaneously acting brakes increases the holding force of the actuator inside of the containment tube. The use of terfenol rods mounted crosswise between opposed brakes shoes takes advantage of the large movement of such rods and the associated large force produced by the rods. Since only the longitudinal change of length is utilized the finish of the terfenol rods is not critical. Only the ends need be machined to a significant degree of accuracy. The use of terfenol allows the use of safer low voltage power supplies in the range of 10 to 30 volts.

The pusher rod may also be terfenol. Using terfenol large strokes are possible, limited only by the length of the containment tube. Increase speed is also possible because the whole length of "active terfenol" rod is energized at once.

BRIEF DESCRIPTION OF THE DRAWINGS

The novel features believed characteristic of the invention are set forth in the appended claims. The invention itself, however, as well as other features and advantages thereof, will be best understood by reference to the description which follows read in conjunction with the accompanying drawings wherein:

DETAILED DESCRIPTION WITH REFERENCE TO THE DRAWINGS

Figure 1:
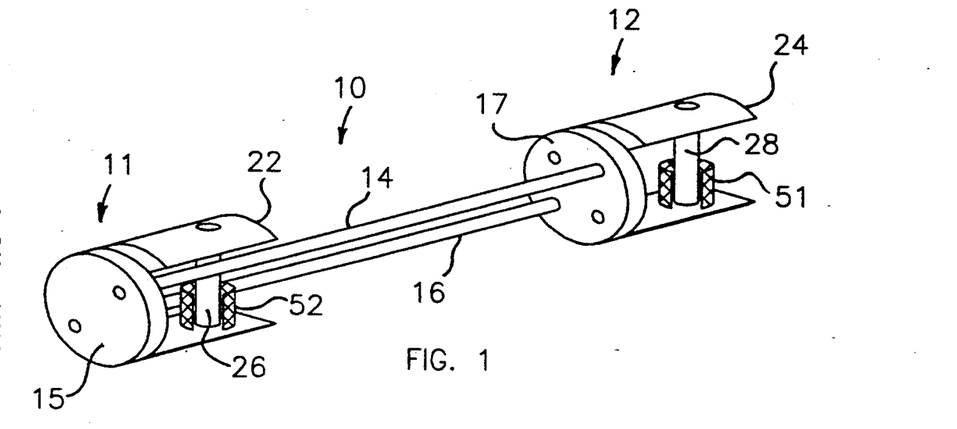
FIG. 1 is a perspective view of a first one of the sets of brake shoe assemblies.

Referring to FIG. 1 there is shown one 10 of two sets 10 and 19 of a pair of spaced apart brake shoe clamps 11 and 12, respectively. Set 10 consists of end plates 15 and 17 connected by diametrically spaced parallel rods 14 and 16. Attached at the periphery of each of plates 15 and 17 at opposed sides thereof are shoes 22 and 24, respectively. A terfenol rod 26 extends between shoes 22 and another 28 between shoes 24. Coils 50, 51, 52 and 53 surround terfenol rods 34, 28, 26, and 36, respectively, and when electrical current is conducted by them they serve to energize corresponding Terfenol rods 26, 28, 34 and 36. Coils 50, 51, 52, and 53 also serve to conduct current which causes the magnetic domains of the terfenol to reorientate.

Figure 2:
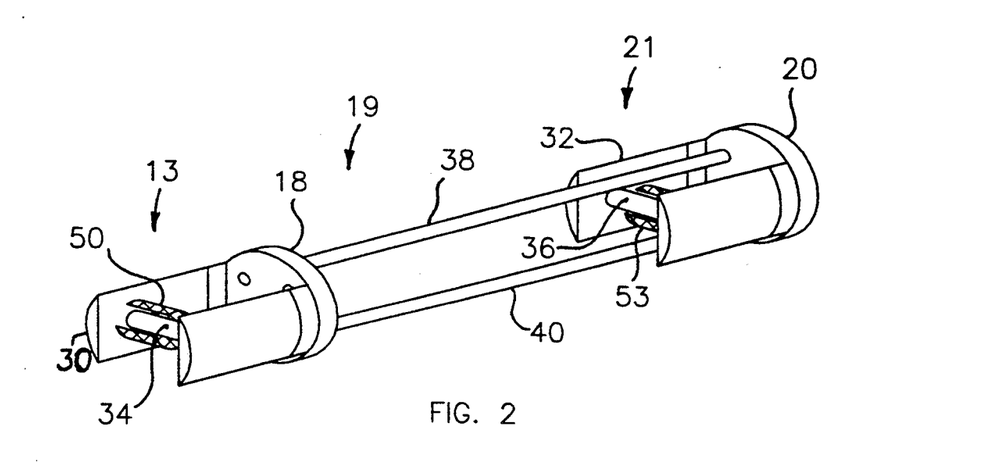
FIG. 2 is a perspective view of a second one of the sets of brake shoe assemblies.
Figure 3:
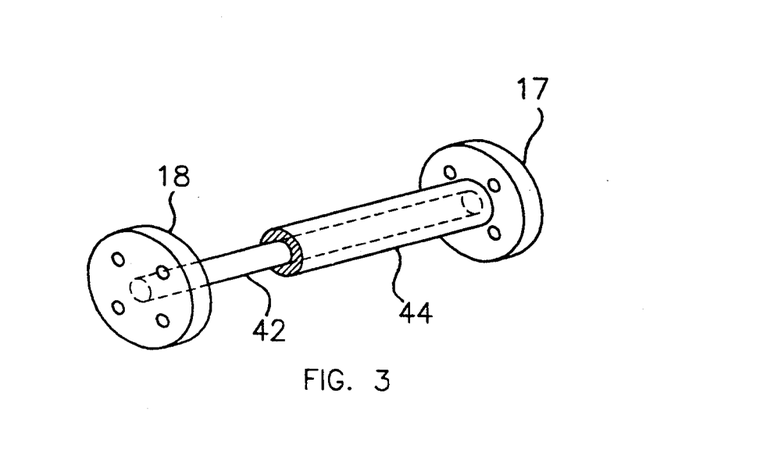
FIG. 3 is a perspective view of terfinol rod and associated partially cut away mounted between plates of the first and second sets of brake shoes assemblies.

The second set 19 of a pair of spaced apart brake shoe clamps 13 and 21 are connected by parallel rods 38 and 40 connecting plates 18 and 20 as shown in FIG. 2. Shoes 30 and 32 project from diametrically opposed positions on the peripheries of plates 18 and 20, respectively, from one side thereof. Referring to FIG. 2, terfenol rods 34 and 36 serve to extend and spread shoes 30 and 32 apart upon being activated by respective coils 50 and 53. Rods 26, 28, 34 and 36 are held in compression even when retracted by brake shoes 22, 24, 30 and 32, respectively, thus, providing prestressing of these Terfenol rods.

Figure 5:
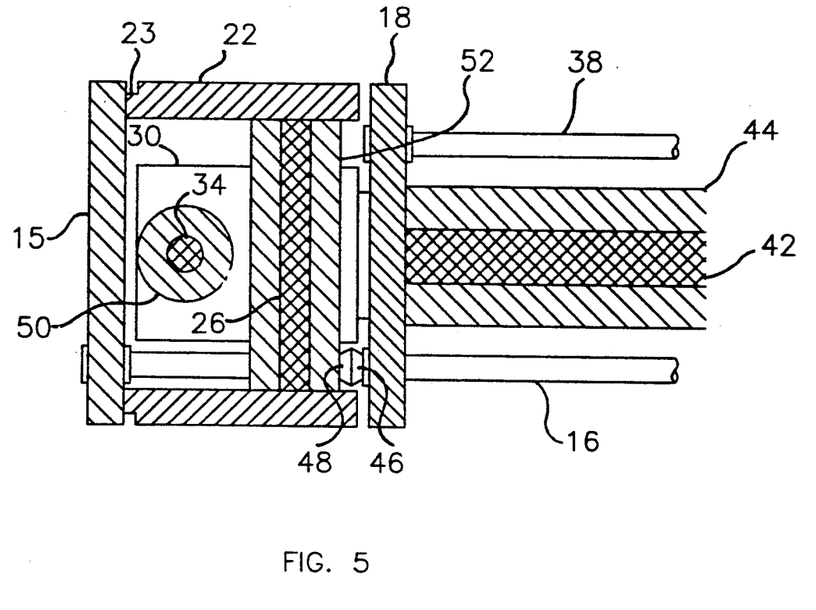
FIG. 5 is a sectional view taken along the line 5—5 in FIG. 4.

As seen in FIG. 5 two sets 10 and 19 form a motor 25 when assembled such that shoes 30 of clamp 13 are interspaced with shoes 22 of clamp 11 and shoes 24 of clamp 12 are interspaced with shoes 32 of clamp 21. Thus, terfenol rod 26 passes between rod 34 and plate 18. Similarly, rod 28 passes between rod 36 and plate 20. Terfenol pusher rod 42 is surrounded by coil 44 which causes rod 42 to elongate in response to electrical current being conducted thereby. Rod 42 extends from plate 18 of clamp 13 to plate 17 of clamp 12. The diameter of the actuator assembly 25 is slightly less than that of an interior diameter of a containment tube 47 along which the motor travels.

As seen in the sectional view of FIG. 5, each shoe 22 is undercut to form a thin web connecting each shoe 22 to backing plate 15. Shoes 30, 32 and 24 have similar webs. The webs 23 allow shoes 22 to flex outwardly when corresponding terfinol rod 26 is caused to extend so as to clamp shoes 22 firmly to the inside of tube 47. A terfenol rod 34 oriented 90° relative to rod 26 causes shoes 30 to extend outwardly in the same way, but in a direction orthogonal to the movement of shoes 22. Disc springs or bell washers 46 are mounted in compression against a shoulder 48 on rod 16 and against plate 18. There are two such springs 46 at each end of assembly 25. An identical disc spring (not shown) is mounted against a like shoulder (not shown) on each of rods 14, 38, and 40 and respective plates 18 and 17. The disc springs 46 thus, hold terfenol pusher rod 42 in compression between plates 18 and 17.

Figure 7:
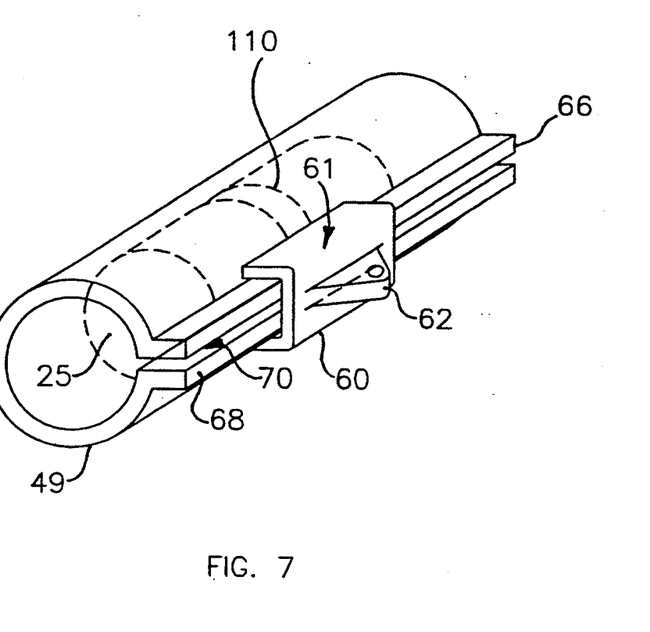
FIG. 7 is a perspective view of an actuator within a containment tube having an external take off assembly.
Figure 8:
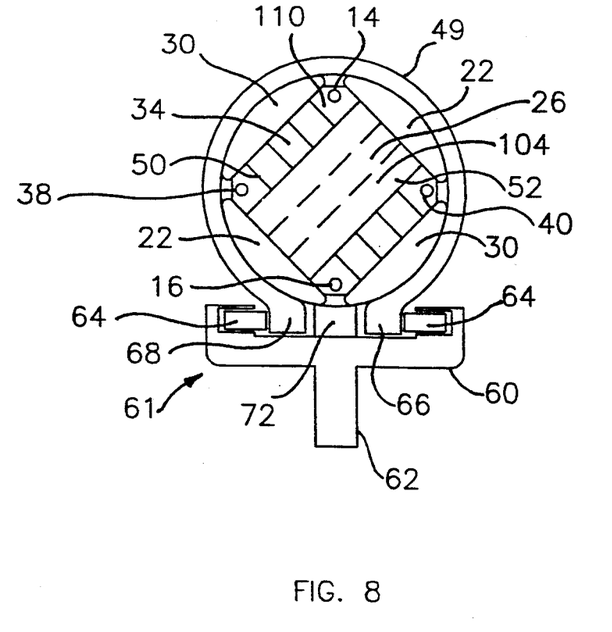
FIG. 8 is an end view of the actuator of FIG. 6 without the end plate.

Referring to FIGS. 7 and 8 there is shown a containment tube 49 having parallel, spaced apart, elongated rails 66 and 68 in between which is an opening 70 communicating with an interior of tube 49. Within tube 49 is the actuator assembly 25. A power take off assembly 61 is made up of a C-shaped plate 60 which has roller bearings 64 mounted on each end of opposed sides of the C-shaped plate 60. The bearings roll on the outside of rails 66 and serve to maintain the rigidity of tube 49 when subjected to braking force from actuator assembly 25. A protrusion 72 extends into opening 70 and removably affixes to the plate 110. Plate 110 is mounted on rods 14, 16, 38 and 40 which pass through the former and have shoulders such that rods 14 and 16 engage plate 110 when moving in one direction and rods 38 and 40 engage plate 110 when moving in the other direction. A bracket coupling piece 62 extends from the side of plate 60 opposite to protrusion 72.

Figure 4:
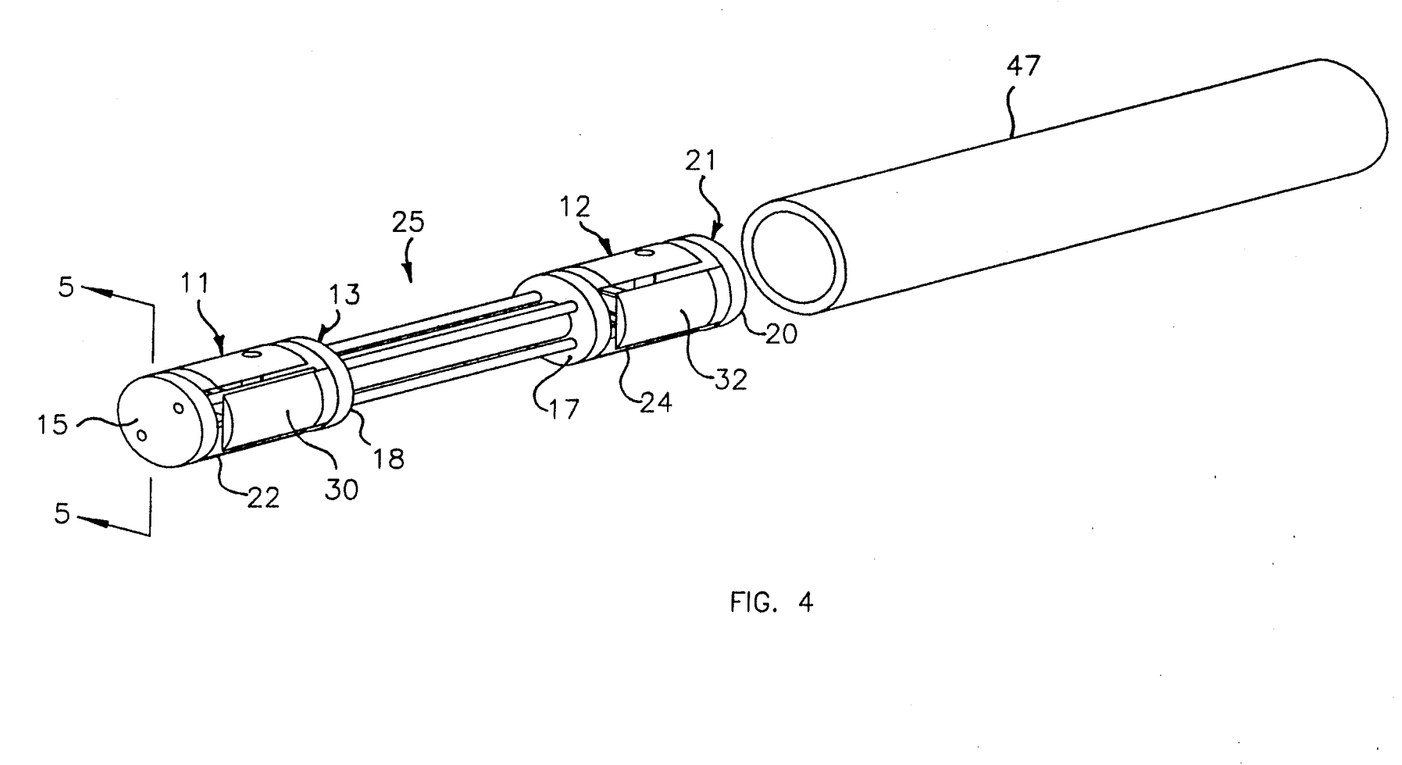
FIG. 4 is a perspective view of an assembled motor and a tube through which the motor moves.

Operationally, actuator 25 proceeds by first clamping the shoes of one of the two sets 10 and 19 to containment tube 47. Assume that the shoes 22 and 24 of set 10 are clamped through expansion of rods 26 and 28 while those 30 and 32 of set 19 are unclamped. Referring to FIGS. 4 and 5, expansion of pusher rod 42 causes plate 18 to move to the left closer to plate 15 and to compress disc springs 46. Once rod 42 has been expanded, shoes 30 and 32 of set 19 are expanded to clamp them to containment tube 47. Shoes 22 and 24 are then released and plate 15 then springs to the left in response to the force exerted by the compressed disc springs 46. Shoes 22 and 24 are then clamped and shoes 30 and 32 again unclamped. The cycle is repeated with the result that the motor moves to the left in small discrete steps the magnitude of which are determined by the strain on rod 42 and the compression of disc springs 46.

Figure 6:
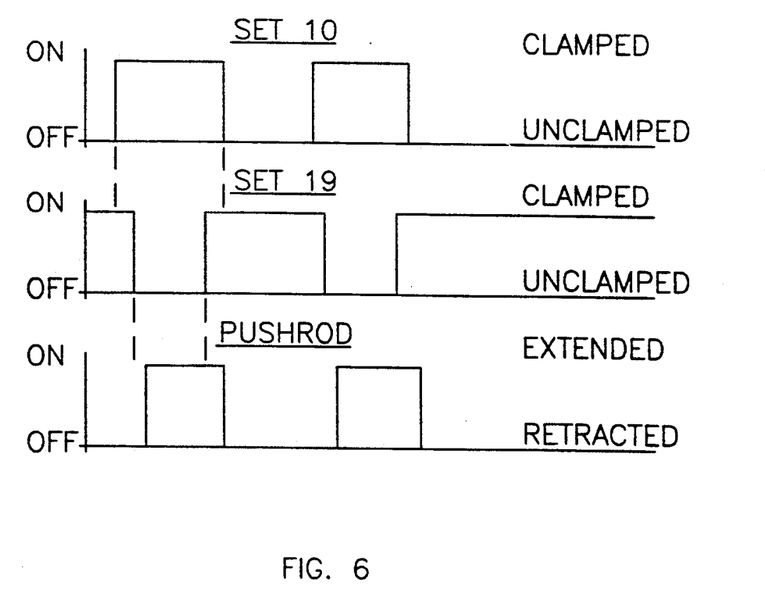
FIG. 6 are timing diagrams showing the times at which the brakes are applied and withdrawn and when the pushrod is extended and retracted.

The timing of activation and deactivation of the brakes of each set 10 and 19 and that of the pushrod is shown in FIG. 6. As both the rod strain and the compression of disc springs 46 can be accurately controlled, the movement of the actuator is precise. Since there are two spaced apart pairs of shoes which are always clamped, there is little or no slippage. Moreover, since the pusher rod 42 is not released until the brake rods 34 and 36 have been de-activated and brake rods 26 and 28 have been de-activated there is little or no slippage. Because the actuator 25 is symmetrical, movement in either direction is possible.

Figure 9:
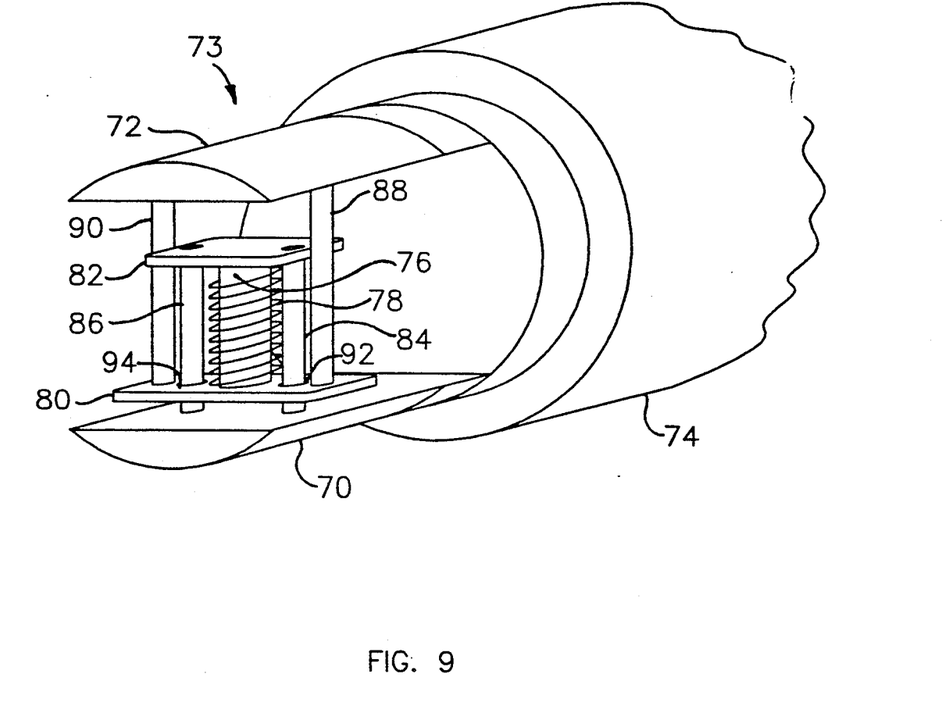
FIG. 9 is an end view of an alternative brake shoe assembly.

Referring to FIG. 9 there is shown a brake shoe assembly 73 comprising two shoes 70 and 72. Assembly 73 is slidable within containment tube 74. A base plate 80 is suspended by posts 88 and 90 from shoe 72. Similarly, top plate 82 is supported by posts 84 and 86 from shoe 70. Posts 84 and 86 pass through openings 92 and 94, respectively, in base plate 80. A terfenol rod 76 extends between top plate 82 and base plate 80. Coil 78 surrounds rod 76 and, upon conducting electrical current, serves to alter the orientation of the magnetic domains of the latter so as to cause it to extend longitudinally.

From the mechanical configuration of assembly 73 it will be seen that extension of rod 76 causes plates 82 and 80 to move away from each other and shoes 70 and 72 to move towards each other as a consequence. Similarly, when power through coil 78 is removed, rod 76 contracts and pulls plates 82 and 80 towards each other and pushes shoes 70 and 72 away from each other. Thus, the condition when no power is passing through the coil 78 is for the brake shoes 70 and 72 to engage the interior surface of containment tube 74. The timing diagram for the device of FIG. 9 is slightly different than that of FIG. 6 in that the "extended" and "retracted" designations are reversed for the pushrod as the brake is on when the pushrod is retracted.

Figure 10:
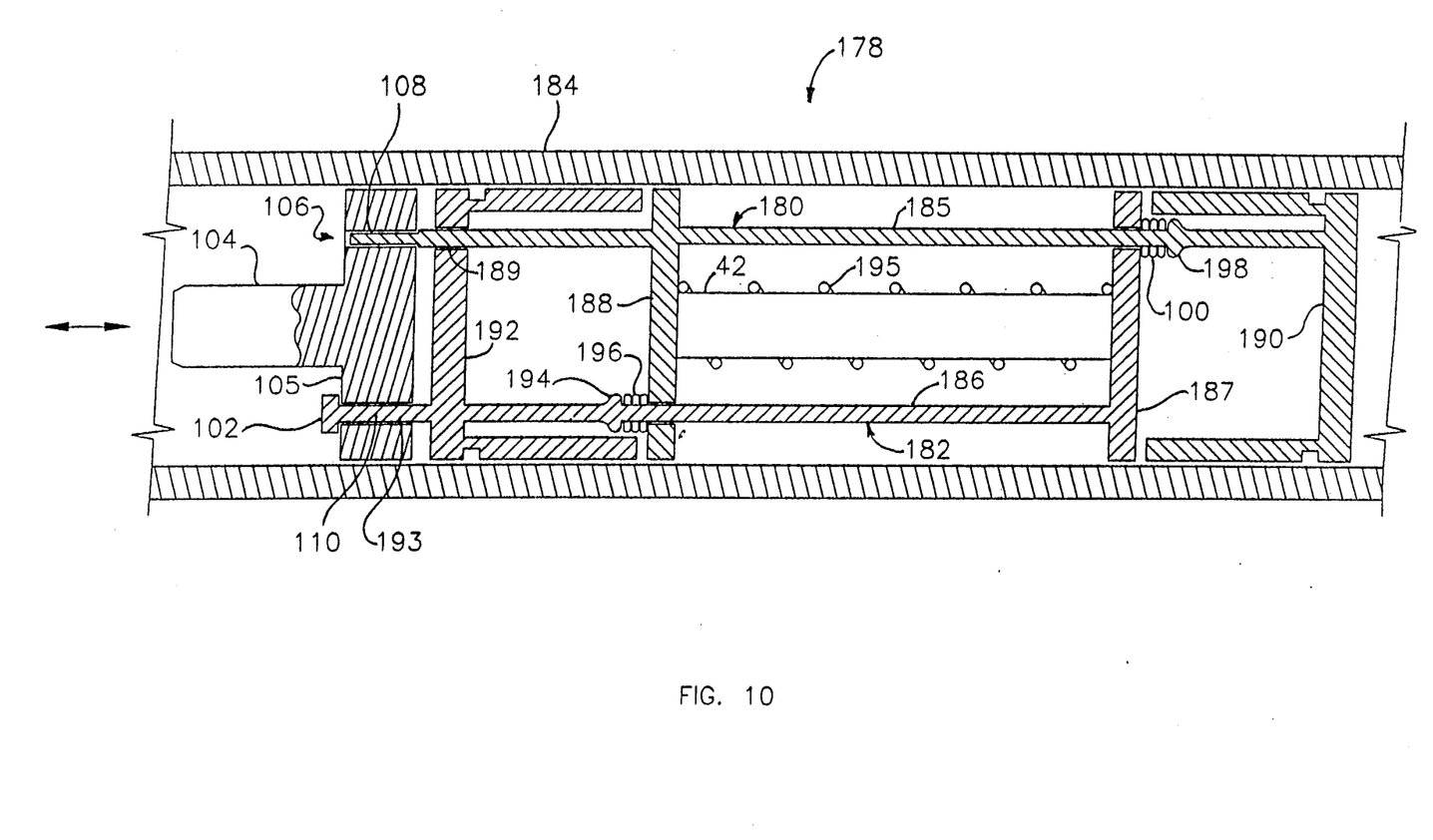
FIG. 10 is a sectional view of the motor within a containment tube showing a power take-off arrangement.

Referring to FIG. 10 there is shown a motor or actuator 78 within a containment tube 184 similar to FIG. 5 having frame assemblies or sets 180 and 182. The brake rods have been omitted for ease of illustration. In this case rod 185 extends to the left of plate 188 passing through a hole 189 in back plate 192 and having a segment 108 of smaller diameter slidably insertable in a hole 106 in power take-off plate 105. Rod 186 is extended to the left of plate 192 passing through hole 193 in the latter and terminating in a lug 102 of widened diameter larger than that of hole 193. Bell washers 196 and 100 bias plates 188 and 187, respectively, away from ridges 194 and 198, respectively, on rods 186 and 185, respectively.

In operation when terfenol rod 42 is lengthened by current through coil 195 if set 182 is clamped to tube 184 the rod 42 forces plate 188 and hence rod 185 to the left causing the shoulder between rod 85 and segment 108 to push take off plate 105 to the left against the bias on spring or bell washer 196. If set 180 is clamped to tube 184 then plate 187 is pushed to the right causing lug 102 to pull take off plate 105 to the right. Power is taken off of shaft 104 which is affixed to plate 105 axially of tube 184.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modification or embodiments as fall within the true scope of the invention.

I claim:
1. An actuator comprising:
   (a) first and second brake sections, one of said first and second sections movable relative to the other along a predetermined axis;
   (b) spaced apart pairs of brakes in each of said brake sections;
   (c) means for biasing said first brake section away from said second brake section in a direction along said predetermined axis;
   (d) a pusher rod between said first and second sections parallel to the predetermined axis, operative in response to an activating control signal to expand axially and, upon removal of the signal, to contract to its original length; and
   (e) means for selectively activating said push rod and the brakes in each section such that said actuator moves in a selected direction along said axis.

2. An actuator according to claim 1, wherein said biasing means is a spring.

3. An actuator according to claim 1, wherein said pusher rod is a magnetostrictive material.

4. An actuator according to claim 1, including means for prestressing said pusher rod.

5. An actuator according to claim 2, wherein said spring is operative to prestress said pusher rod.

6. An actuator comprising:
   (a) first and second brake sections, one of said first and second sections movable relative to the other along a predetermined axis;
   (b) spaced apart pairs of brakes in each of said brake sections;
   (c) a spring connected between said first and second brake sections for biasing said first section away from said second section along said axis;
   (d) a magnetostrictive pusher rod between said first and second sections parallel to the predetermined axis, and an activating coil mounted around said pusher rod, said pusher rod operative in response to electrical current passing through said coil to expand axially and upon cessation of the current to contract to its original length; and
   means for selectively activating the brakes in each section and said push rod such that said actuator moves in a selected direction along said axis.

7. An actuator according to claim 6, wherein each of said brakes includes a pair of oppositely disposed brake shoes and a magnetostrictive brake rod with an electrically conducting coil around said brake rod mounted so as to extend longitudinally between said shoes, said rod reversibly expandable in response to electrical current passing through said coil, said brake shoes adapted to engage an interior surface of a containment tube so as to lock an associated brake section of said actuator to said tube by friction in response to an associated one of said rods being in one of an extended or retracted positions.

8. An actuator according to claim 7, wherein said brake rods and said pusher rod are terfenol.

9. An actuator according to claim 6, wherein the brake rods are held in compression by associated ones of said brake shoes, and said pusher rod held in compression by said spring.

10. An actuator according to claim 7, wherein said brake shoes are disposed parallel to each other and to the predetermined axis and extend out from one face of a plate at diametrically opposed peripheral regions thereof such that ends of said plates can flex outwardly of said axis in response to one of elongation and retraction of an associated rod.

11. An actuator according to claim 10, wherein said brake shoes flex outwardly in response to extension of said brake rods.

12. An actuator according to claim 10, wherein said brake rods abut opposed surfaces of associated pairs of said brake shoes and cause said brake shoes to flex outwardly in response to extension of said rod.

13. An actuator according to claim 10, wherein said brake shoes flex outwardly in response to retraction of said brake rods.

14. An actuator according to claim 13, including a base plate suspended and spaced apart from one of said brake shoes and a top plate suspended and spaced apart from another of said brake shoes such that when said plates move away from one another, said brake shoes move towards one another and said brake rod abuts said base plate at one end and said top plate at another end.

15. An actuator movable along an interior of a containment tube, comprising:
  (a) first and second brake sections, said first section movable along a predetermined axis relative to said second section;
  (b) a pair of brakes at each end of said brake sections, each pair including diametrically opposed shoes and a terfenol rod extending longitudinally and orthogonally between said brake shoes, a coil mounted around said rod, said rod operative to extend in response to electrical current passing through the coil and to retract to its original position in response to cessation of the current, said pairs of brake shoes operative to flex outwardly so as to engage interior walls of said tube and lock the associated section to said tube in response to one of extension or retraction of corresponding ones of said rods;
  (c) a spring connected between said first and second brake sections for biasing said first section away from said second section along said predetermined axis;
  (d) a terfenol pusher rod extending longitudinally between said first and second sections parallel to the predetermined axis, a coil surrounding said rod, said pusher rod operative in response to activating electrical current through said coil to expand axially and push an unclamped one of said first and second sections away from a clamped one and upon removal of the signal to contract to its original length and wherein said spring holds said pusher rod in compression; and
  (e) means for selectively activating said push rod and the brakes in each section such that said actuator moves in a selected direction along said axis.

16. An actuator according to claim 15, wherein said brake rods abut opposed interior surfaces of respective ones said brake shoes and in response to electrical current through an associated coil cause said brake shoes to flex outwardly and engage an interior surface of a containment tube so as to lock an associated brake section of said actuator to said tube by friction.

17. An actuator according to claim 15, including a power take off plate coupled to said first and second brake sections such that said first brake section pushes said plate one way when said second section is locked and said second section pulls it in an opposite direction when said first section is locked.

18. An actuator according to claim 15, wherein for each pair of brake shoes a base plate is affixed to but suspended from an interior surface of one of said brake shoes in space apart relationship and a top plate is affixed to but suspended from another of said brake shoes in spaced apart relationship thereto and said top plate and said base plate are aligned along a direction perpendicular to said brake shoes with one of the brake rods having one end abutting said base plate and another abutting said top plate, each of said pair of brake shoes operative to flex inwardly in response to elongation of and associated one of said brake rods and unlock from said containment tube.

19. An actuator according to claim 15, wherein said tube has an elongated opening parallel to an axis thereof and parallel webs connected to said tube on either side of said opening and including a take off coupling plate affixed to said take off plate and mounted around said webs with roller bearings mounted on said coupling plate and bearing on said webs so as to maintain rigidity of said tube upon engagement of said tube by said brake shoes.

* * * * *